United States Patent
Zhang et al.

(10) Patent No.: US 10,581,342 B2
(45) Date of Patent: Mar. 3, 2020

(54) THREE-LEVEL TWO-STAGE DECOUPLED ACTIVE NPC CONVERTER

(71) Applicant: General Electric Company, Schenectady, NY (US)

(72) Inventors: Di Zhang, Niskayuna, NY (US); Jiangbiao He, Niskayuna, NY (US); Sachin Madhusoodhanan, San Jose, CA (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 15/993,945

(22) Filed: May 31, 2018

(65) Prior Publication Data

US 2019/0013743 A1     Jan. 10, 2019

Related U.S. Application Data

(60) Provisional application No. 62/530,530, filed on Jul. 10, 2017.

(51) Int. Cl.
    *H02M 7/487*        (2007.01)
    *H02M 1/34*         (2007.01)
    (Continued)

(52) U.S. Cl.
    CPC .............. *H02M 7/487* (2013.01); *H02M 1/34* (2013.01); *H02M 7/5395* (2013.01);
    (Continued)

(58) Field of Classification Search
    CPC .......... H02M 7/04; H02M 7/12; H02M 7/217; H02M 7/219; H02M 7/42; H02M 7/44;
    (Continued)

(56) References Cited

U.S. PATENT DOCUMENTS 5,982,646 A     11/1999    Lyons et al.
6,058,031 A      5/2000    Lyons et al.
(Continued)

FOREIGN PATENT DOCUMENTS

EP     2582030 A2 *    4/2013            H02M 7/483
EP     3174190 A1 *    5/2017            H02M 7/483
(Continued)

OTHER PUBLICATIONS

Li et al., "Three-Level Active Neutral-Point-Clamped (ANPC) Converter with Fault Tolerant Ability", 2009 Twenty-Fourth Annual IEEE Applied Power Electronics Conference and Exposition, pp. 840-845, Washington, Feb. 15-19, 2009.

(Continued)

*Primary Examiner* — Gary L Laxton
*Assistant Examiner* — Ivan Laboy
(74) *Attorney, Agent, or Firm* — Armstrong Teasdale LLP

(57) ABSTRACT

A system includes a voltage converter and a controller for controlling the operation of the voltage converter. The voltage converter includes a plurality of legs, wherein each leg includes a first and a second set of silicon (Si)-based power devices. The first set of Si-based power devices includes a first and second Si-based power devices connected to each other at a first interconnection node and the second set of Si-based power devices includes a third and fourth Si-based power devices connected to each other at a second interconnection node. The first and second set of Si-based power devices are coupled across a first and second DC voltage sources respectively. A first set of Silicon-Carbide (SiC) based power devices is coupled across the first and second interconnection nodes. The system also includes a snubber capacitor connected across the first and the second interconnection nodes.

20 Claims, 11 Drawing Sheets

(51) Int. Cl.
  *H02M 7/5395* (2006.01)
  *H02M 1/00* (2006.01)
  *H01L 29/16* (2006.01)

(52) U.S. Cl.
  CPC .......... *H01L 29/16* (2013.01); *H01L 29/1608* (2013.01); *H02M 2001/0054* (2013.01); *H02M 2001/346* (2013.01)

(58) Field of Classification Search
  CPC ........ H02M 7/48; H02M 7/483; H02M 7/487; H02M 7/537; H02M 7/5387; H02M 7/53871; H02M 7/5388; H02M 7/539; H02M 7/5395; H02M 7/797; H02M 5/40; H02M 5/42; H02M 5/44; H02M 5/453; H02M 5/458; H02M 5/4585; H02M 2001/0048; H02M 2001/0054; H02M 2001/0058; H02M 2001/342; H02M 2001/344; H02M 2001/346; H02M 2001/348; H02M 1/34; Y02B 70/14; Y02B 70/1483; Y02B 70/1491
  See application file for complete search history.

(56) References Cited

U.S. PATENT DOCUMENTS

| | | | |
|---|---|---|---|
| 6,353,354 B1* | 3/2002 | Detweiler | H02J 1/10 327/110 |
| 6,535,406 B1 | 3/2003 | Asaeda et al. | |
| 6,697,274 B2 | 2/2004 | Bernet et al. | |
| 8,472,153 B1 | 6/2013 | Grbovic | |
| 8,582,331 B2 | 11/2013 | Frisch et al. | |
| 8,929,114 B2 | 1/2015 | Li et al. | |
| 9,385,585 B2 | 7/2016 | Geyer et al. | |
| 2006/0050537 A1* | 3/2006 | Zeng | H02M 3/33569 363/16 |
| 2016/0043659 A1* | 2/2016 | Xu | H02M 1/088 363/131 |
| 2016/0241161 A1* | 8/2016 | Haddad | H02M 7/537 |
| 2016/0268924 A1* | 9/2016 | Fu | H02M 7/483 |
| 2017/0185130 A1* | 6/2017 | Zhang | G06F 1/324 |
| 2017/0310238 A1* | 10/2017 | Fu | H02M 7/487 |
| 2017/0373586 A1 | 12/2017 | Zhang et al. | |
| 2019/0058416 A1* | 2/2019 | Wang | H02M 7/48 |

FOREIGN PATENT DOCUMENTS

| | | |
|---|---|---|
| JP | 2001169563 A | 6/2001 |
| WO | 2013/161045 A1 | 10/2013 |
| WO | 2015155183 A1 | 10/2015 |

OTHER PUBLICATIONS

Jiao et al., "New Modulation Scheme for Three-Level Active Neutral-Point-Clamped Converter With Loss and Stress Reduction", IEEE Transactions on Industrial Electronics, vol. 62, Issue: 9, pp. 5468-5479, Sep. 2015.

Zhang et al., "Three-Level Two-Stage Decoupled Active NPC Converter with Si IGBT and SiC MOSFET", 2017 IEEE Energy Conversion Congress and Exposition (ECCE), pp. 5671-5678, Cincinnati, Oct. 1-5, 2017.

International Search Report and Written Opinion issued in connection with corresponding PCT Application No. PCT/US2018/36150 dated Aug. 30, 2018.

* cited by examiner

THREE-LEVEL TWO-STAGE DECOUPLED ACTIVE NPC CONVERTER

CROSS REFERENCE TO RELATED APPLICATIONS

The present application claims priority to U.S. provisional patent application Ser. No. 62/530,530 filed Jul. 10, 2017, incorporated herein by reference in its entirety.

This invention was made with Government support under contract NNC15CA29C awarded by the National Aeronautics and Space Administration. The Government has certain rights in the invention.

BACKGROUND

Embodiments of present technique relates to power converters and more specifically to a method of operating a three-level two-stage decoupled active neutral point clamped (NPC) converter.

Turboelectric or hybrid electric propulsion can increase aircraft energy conversion efficiency, reduce carbon emissions, and decrease dependency on carbon-based fuels. A megawatt (MW)-class light-weight high-efficiency high-reliability power converter is an essential component of hybrid electric propulsion. Further, to reduce the cable weight, the power converter needs to withstand medium direct current (DC) voltage stress. Moreover, to reduce the weight of a motor used in the hybrid electric propulsion, the power converter output fundamental frequency needs to be high, e.g. above 1 kHz, which accordingly requires higher switching frequency for the power converter.

Silicon carbide (SiC) is a semiconductor that is increasingly being used in power electronic devices such as metal-oxide-semiconductor field-effect transistors (MOSFETs) to meet the high switching frequency and efficiency requirements of power converters. Further, a three-level NPC converter topology is preferred for the power converter, since it can achieve higher voltage rating without devices serialization, better harmonic performance to reduce filter weight, and lower switching loss for high efficiency.

To design such a three-level converter, the foremost challenge is how to minimize a commutation loop inductance. Other than the commutation loop inductance, there are other challenges for SiC MOSFET based multilevel converter as compared to Si IGBT modules. The SiC MOSFETS modules are much more expensive than Si IGBT modules and have intrinsic thermal unbalance characteristics. Methods have been proposed to effectively mitigate the thermal unbalance issue. However, such methods shift more switching actions from a short commutation loop to a long commutation loop. Such methods will lead to much higher system level switching losses.

Therefore, a system and a method that will address the foregoing issues is desirable.

BRIEF DESCRIPTION

In accordance with an embodiment of the present technique, a system having a voltage converter and a controller to control the operation of the voltage converter is provided. The voltage converter includes a plurality of legs, wherein each of the leg includes a first and a second set of Silicon (Si)-based power devices connected across a first and a second direct current (DC) voltage sources respectively and at a fourth interconnection node to each other. The first set of Si-based power devices includes a first and a second Si-based power device connected to each other at a first interconnection node. Further, the second set of Si-based power devices includes a third and a fourth Si-based power device connected to each other at a second interconnection node. The system also includes a first set of silicon-carbide (SiC)-based power devices coupled across the first and second interconnection nodes, wherein the first set of SiC-based power devices includes a first SiC-based power device and a second SiC-based power device connected to each other at a third interconnection node. The system also includes a snubber capacitor connected across the first and the second interconnection nodes.

In accordance with another embodiment of the present technique, a system having a voltage converter and a processor to control the operation of the voltage converter is provided. The voltage converter includes a plurality of legs, wherein each leg comprises a first set of silicon (Si)-based power devices coupled to a first DC voltage source and a second set of Si-based power devices coupled to a second DC voltage source. The first set of Si-based power devices and the second set of Si-based power devices are coupled in series. The voltage converter also includes a first set of silicon-carbide (SiC)-based power devices coupled to the first set of Si-based power devices and to the second set of Si-based power devices and a snubber capacitor connected across the first set of SiC-based power devices. The processor is configured to control switching of each SiC-based power device of the first set of SiC-based power devices and each Si-based power device of the first and second sets of the Si-based power devices such that one SiC-based power device of the first set of SiC-based power electronic devices is conducting a current in series with one Si-based power electronic device of the first or second set of the silicon-based power electronic devices at any given time.

DRAWINGS

These and other features and aspects of embodiments of the present invention will become better understood when the following detailed description is read with reference to the accompanying drawings in which like characters represent like parts throughout the drawings, wherein.

DETAILED DESCRIPTION

Unless defined otherwise, technical and scientific terms used herein have the same meaning as is commonly understood by one of ordinary skill in the art to which this disclosure belongs. The terms "first", "second", and the like, as used herein do not denote any order, quantity, or importance, but rather are used to distinguish one element from another. Also, the terms "a" and "an" do not denote a limitation of quantity, but rather denote the presence of at least one of the referenced items. The term "or" is meant to be inclusive and mean one, some, or all of the listed items. The use of "including," "comprising" or "having" and variations thereof herein are meant to encompass the items listed thereafter and equivalents thereof as well as additional items. The terms "connected" and "coupled" are not restricted to physical or mechanical connections or couplings, and can include electrical connections or couplings, whether direct or indirect. Furthermore, the terms "circuit" and "circuitry" and "controller" may include either a single component or a plurality of components, which are either active and/or passive and are connected or otherwise coupled together to provide the described function.

As used herein, the term "module" refers to software, hardware, or firmware, or any combination of these, or any system, process, or functionality that performs or facilitates the processes described herein.

A topology named three-level two-stage decoupled active neutral point clamped (3L-TDANPC) converter is proposed. The 3L-TDANPC converter is built with IGBT and SiC MOSFET modules. The commutation loops of SiC MOSFETs are all within the modules to keep the switching loss low. In addition, the utilization of IGBT modules helps reduce the system cost significantly and can limit the short-circuit current flowing through SiC MOSFETs to a very safe level.

Figure 1:
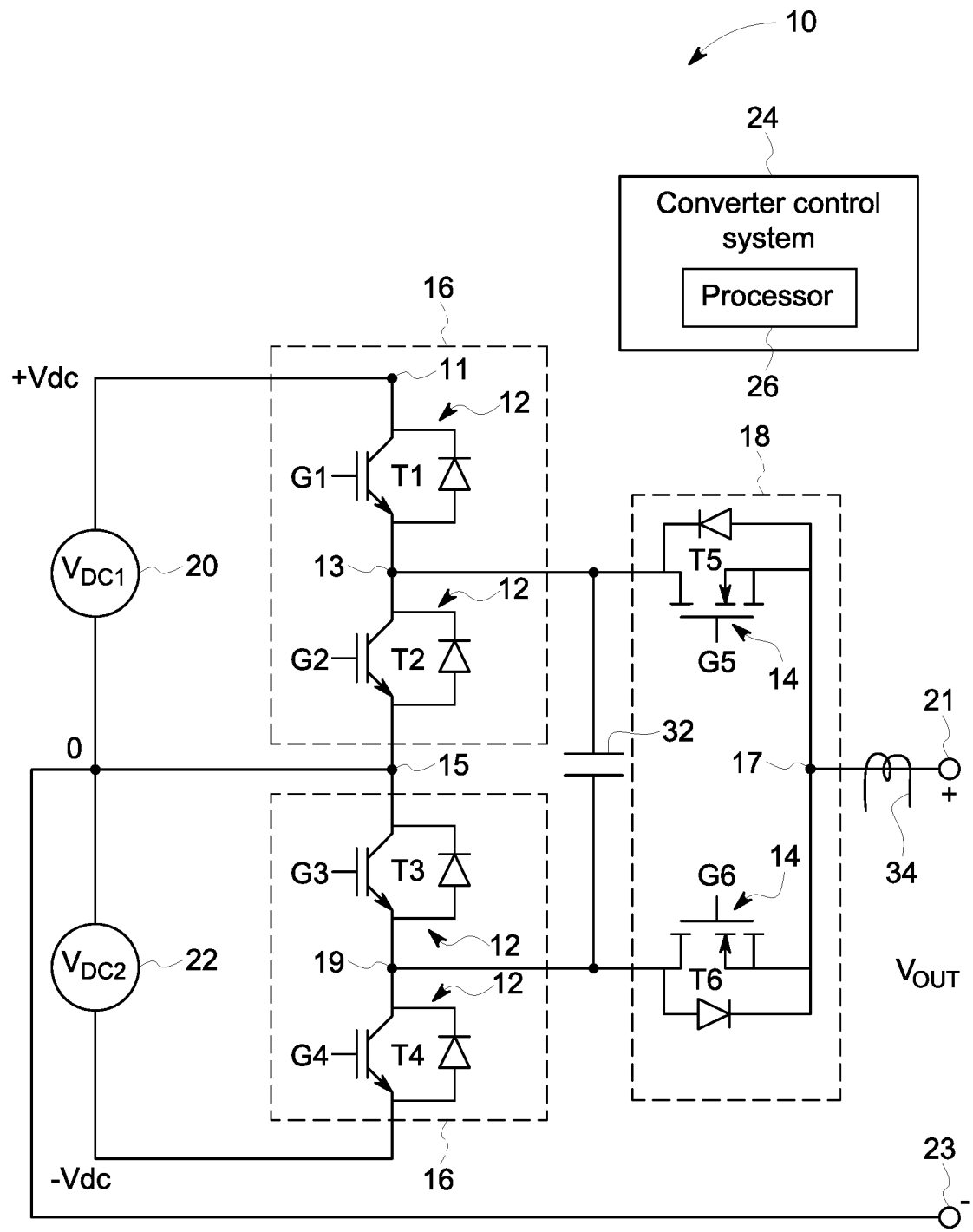
FIG. 1 illustrates a schematic diagram of a three-level two-stage decoupled active neutral point clamped (3L-TDANPC) converter system, in accordance with an embodiment.

By way of introduction, FIG. 1 illustrates a schematic diagram of a three-level two-stage decoupled active neutral point clamped (3L-TDANPC) converter system 10 that incorporates both Si power electronic devices and SiC power electronic devices to convert DC voltage signals to AC voltage signals, in accordance with an embodiment of the present approach. It should be noted that the schematic diagram of FIG. 1 may represent one phase leg of a multi-phase converter system. As such, the 3L-TDANPC converter system 10 may be employed on one or more legs of such a multi-phase converter system.

In one embodiment, the Si power electronic devices and the SiC power electronic devices of the 3L-TDANPC converter system 10 may be Si IGBTs 12 and SiC MOSFETs 14, respectively. The Si IGBTs 12 may include various types of IGBTs of different ratings (e.g., 1.7 kV, 3.3 kV, 4.5 kV, or 6.5 kV IGBT) that uses Si as the semiconductor material to switch between conductive to non-conductive states. In the same manner, the SiC MOSFETs may include various types of MOSFETs of different ratings that uses SiC as the semiconductor material to switch between conductive to non-conductive states.

In some embodiments, multiple Si IGBTs 12 may be grouped together as part of a module 16. For example, in the converter system 10, two Si IGBTs 12 may be electrically coupled in series with each other and provide three interconnection nodes (e.g., 11, 13, 15) where the module 16 may be coupled to other electrical components. The interconnection nodes may be located at a collector side of one of the Si IGBTs 12, at an emitter side of one of the Si IGBTs 12, and in between two Si IGBTs 12.

In one embodiment, a first Si IGBT T1 is connected to a second Si IGBT T2 at a first interconnection node 13. Similarly, a third Si IGBT T3 is connected to a fourth Si IGBT T4 at a second interconnection node 19. Further, an emitter of the first Si IGBT T1 is connected to a collector of the second Si IGBT T1 at the interconnection node 13 and an emitter of third Si IGBT T3 is connected to a collector of the fourth Si IGBT T4 at the interconnection node 19. Further, the two modules 16 of Si IGBTs are connected to each other at a fourth interconnection node 15.

In the same manner, multiple SiC MOSFETs 14 may be grouped together as part of a module 18, such that two SiC MOSFETs 14 (T5 and T6) may be electrically coupled in series with each other at a third interconnection node 17. Moreover, the module 18 may be connected across the first interconnection node 13 and the second interconnection node 19. The interconnection node 17 of the module 18 may be located where a drain side of SiC MOSFETs T5 is connected to a source side of the SiC MOSFET T6. Moreover, a load may be connected to the interconnection node 17.

Each Si IGBT module 16 of the converter system 10 may be coupled across a DC voltage source (e.g., DC voltage source 20, DC voltage source 22). The interconnection node (e.g., 13, 19) or output of each Si IGBT module 16 may then be coupled in series with the SiC MOSFET module 18. For instance, the interconnection node in between two Si IGBTs 12 of the modules 16 may be coupled to a source side and a drain side of the SiC MOSFETs of the module 18. A snubber capacitor 32 is also placed across the two interconnection nodes 13 and 19. The snubber capacitor 32 divides a large commutation loop (in absence of the snubber capacitor 32) for Si IGBTs and SiC MOSFETs into two smaller loops as will be discussed in subsequent paragraphs. With the help of the snubber capacitor, the commutation loop inductance for the SiC MOSFETs is minimized. Thus, the 3L-TDANPC converter can achieve very low switching loss even though the majority part of the converter is Si IGBTs.

The AC output voltage of the converter system 10 may be provided at the output terminals (e.g., 21, 23), which are connected to the interconnection node (e.g., 17) between the SiC MOSFETs of the module 18 and to the interconnection node (e.g., 15) between the voltage source 20 and the voltage source 22. In some embodiments, the voltage source 20 and the voltage source 22 both provide the same amount of DC voltage. As such, the Si IGBTs 12 and the SiC MOSFETs 14 may be switched on and off in a controlled manner to convert a DC voltage signal provided via the voltage sources 20 and 22 to an AC voltage signal output by the converter system 10. The AC voltage signal output may then be provided to various types of AC powered devices, such as AC motors and the like, to perform various types of operations.

In one embodiment, the switching of the Si IGBTs 12 and the SiC MOSFETs 14 may be controlled by gate signals provided to gates of the Si IGBTs 12 and the SiC MOSFETs 14. As such, the converter system 10 may include a converter control system (or controller) 24, which may provide gate signals to each of the Si IGBTs 12 and the SiC MOSFETs 14 in the converter system 10 to control operation of the converter system 10.

The converter control system 24 may generally include a processor 26 that determines appropriate gate signals to provide to the Si IGBTs 12 and the SiC MOSFETs 14 of the converter system 10 to produce a desired AC voltage output signal using the DC voltage sources 20 and 22. The processor 26 may be any type of computer processor or microprocessor capable of executing computer-executable instructions (e.g., software code, programs, applications). The processor 26 may also include multiple processors that may cooperate to perform the operations described below.

Generally, as discussed above, the processor 26 may execute software applications that include programs to determine gate signals to provide to the Si IGBTs 12 and the SiC MOSFETs 14, such that the resulting AC voltage output corresponds to a desired voltage signal. For example, FIG. 2 illustrates an example timing diagram 30 of gate signals provided to respective gates of the Si IGBTs 12 and the SiC MOSFETs 14 for the embodiment of the converter system 10 of FIG. 1.

However, when the gate signal is removed from a respective Si IGBT 12 and the Si IGBT turns off or enters a non-conductive state, the corresponding SiC MOSFET 14 that was coupled in series with the respective Si IGBT 12 will already be turned off. That is, the corresponding SiC MOSFET 14 may be in a non-conductive state sooner than its corresponding Si IGBT 12. As such, when the gate signal of the corresponding Si IGBT 12 is removed, the current in the Si IGBT 12 is already zero due to the SiC MOSFET 14 already being off. As a result, the Si IGBT 12, which traditionally has higher switching losses as compared to SiC MOSFETs, has little or no loss during turn off.

In certain embodiments, the processor 26 may provide gate signals to the Si IGBTs 12 and the SiC MOSFETs 14 such that one Si IGBT 12 will be in series with one SiC MOSFET 14 at any given time. Additionally, the processor 26 may send gate signals to the Si IGBTs 12 to cause the Si IGBTs 12 to switch at a fundamental line frequency (e.g., 60 Hz) and send gate signals to the SiC MOSFETs 14 to switch at a higher frequency (e.g., >1 kHz) to synthesize the desired AC voltage output waveform. Accordingly, as shown in FIG. 2, the gate signals (e.g., G1, G2, G3, G4) provided to the Si IGBTs 12 change less frequently as compared to the gate signals (e.g., G5, G6) provided to the SiC MOSFETs 14. As a result, AC voltage output 40 (reference wave) may correspond to a desired sine wave, as depicted in FIG. 2. FIG. 2 also depicts a carrier wave 42. The intersection of the carrier wave 42 and the AC voltage output 40 generally forms a square waveform or a pulse width modulation (PWM) gate waveform, which can be used to control the Si IGBTs 12 and the SiC MOSFETs 14.

Figure 2:
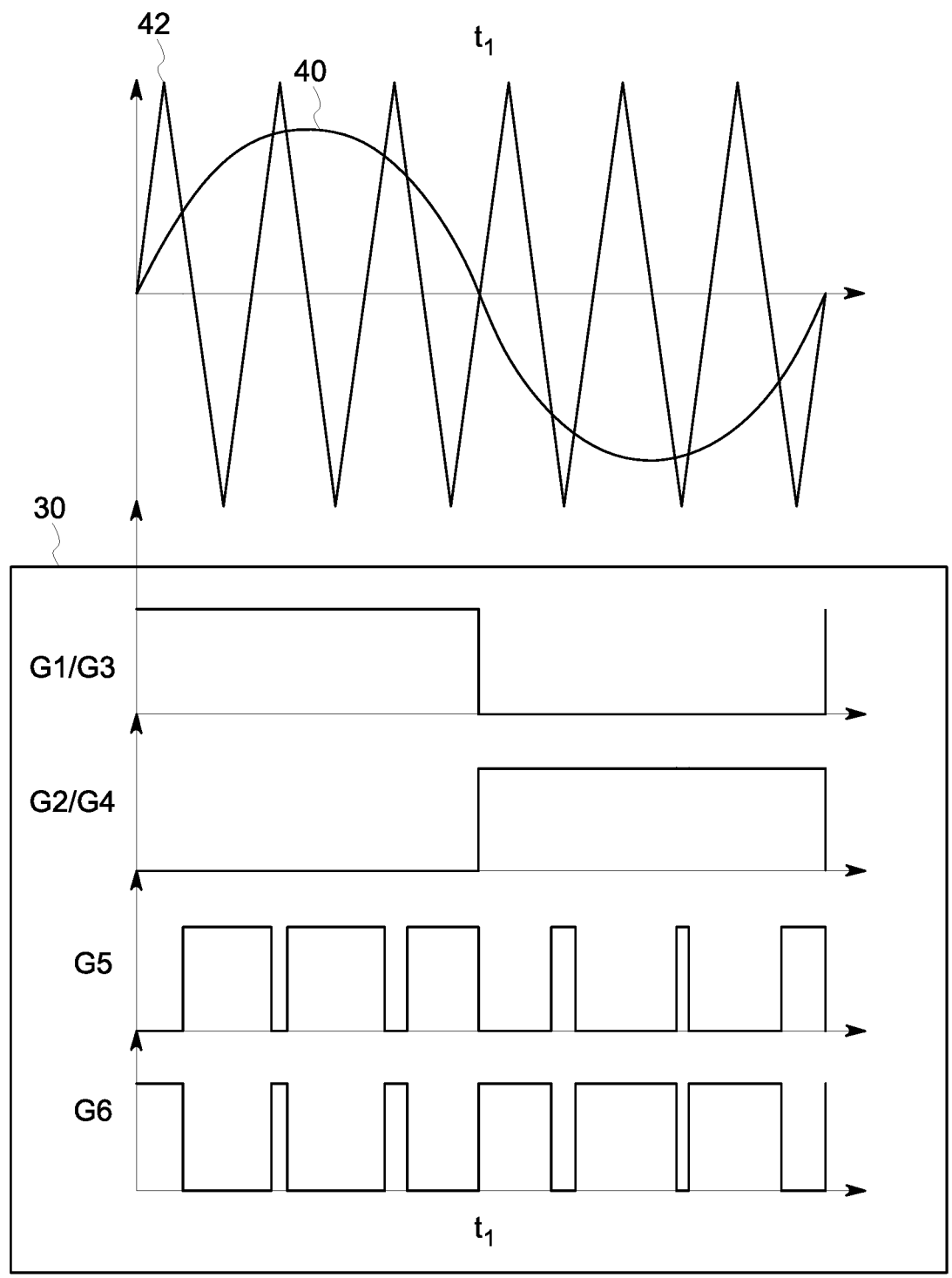
FIG. 2 is graph of voltage signals output by the 3L-TDANPC converter system along with a timing diagram of gate signals provided to switching devices in the hybrid converter system of FIG. 1, in accordance with an embodiment.

It should be noted that FIG. 2 is just one example of gate signals and other methods of generating gate signals are within the scope of the present technique as will be described below. In one embodiment, the processor 26 may coordinate the gate signals provided to the Si IGBTs 12 and the SiC MOSFETs 14 based on output voltage polarity and output current of direction of the 3L-TDANPC converter 10. For example, if output voltage polarity is positive (i.e., output terminal 21 positive is with respect to output terminal 23) and output current is positive (i.e., the output current is going out of the converter) then the processor may provide gate signals such that during commutation of switch T5 (SiC MOSFET), switches T1 and T5 (SiC MOSFET) are turned off simultaneously. This results in damping of a LC resonance formed during the commutation of switch T5 as will be described in subsequent paragraphs. In one embodiment, a sensor 34 may be used to determine the direction of the output current.

Figure 3:
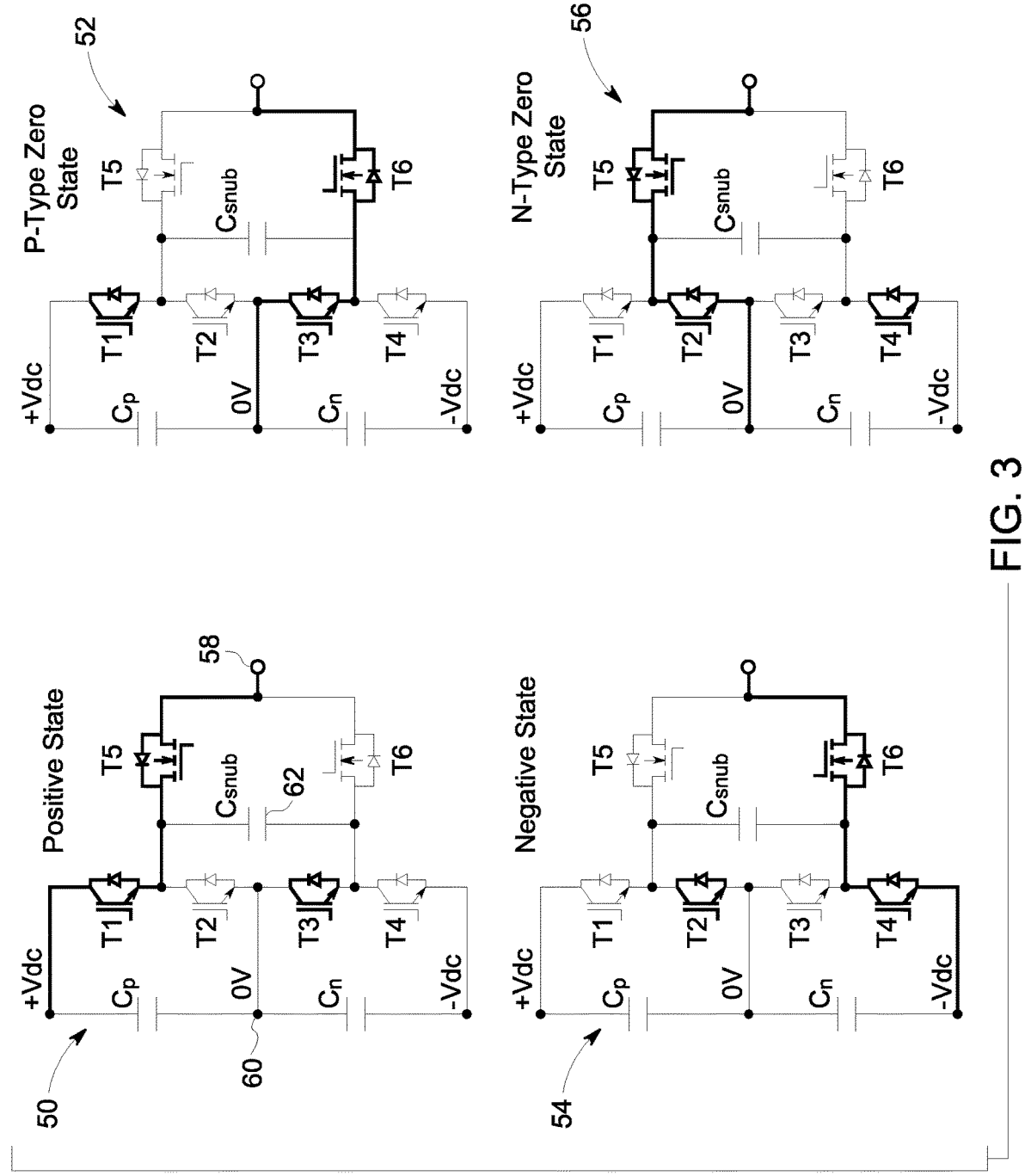
FIG. 3 illustrates schematic diagrams of Four basic operating states of the 3L-TDANPC converter—a positive state, a P-type zero state, a negative state, and a N-type zero state, in accordance with an embodiment.

FIG. 3 illustrates schematic diagrams of Four basic operating states of the 3L-TDANPC converter a Positive (P) state (50); a P-type zero state (52); a Negative (N) state (54); and a N-type zero state (56), in accordance with an embodiment. As discussed earlier, the output voltage of the 3L-TDANPC converter is an AC voltage waveform. The positive state here refers to the voltage at an output terminal 58 being positive with respect to a DC terminal 60 and the negative state refers to the voltage at output terminal 58 being negative with respect to DC terminal 60. Further, the P-type zero state refers to the voltage at an output terminal 58 being zero with respect to a DC terminal 60 with switch T3 being in ON position and the N-type zero state refers to the voltage at output terminal 58 being zero with respect to DC terminal 64 with switch T2 (instead of T3) being in ON position.

In each operating state, the controller is configured to turn ON one Si-based power device from the first set of Si-based power devices (i.e., either switch T1 or switch T2) and another Si-based power device from the second set of Si-based power devices (i.e., either switch T3 or T4). Further, in each operating state, the controller is configured to turn ON one SiC-based power device i.e., either switch T5 or switch T6 such that the one SiC-based power device and one of the Si-based power device that is turned ON together carry a load current in series.

As can be seen from FIG. 3, the Si-based power device and the SiC-based power device that carry the load current in series include i) the switch T1 and the switch T5 during the positive state 50, ii) the switch T3 and the switch T6 during the P-type zero state 52, iii) the switch T4 and switch T6 during the negative state 54, and iv) the switch T2 and switch T5 during the N-type zero state 56.

Figure 4:
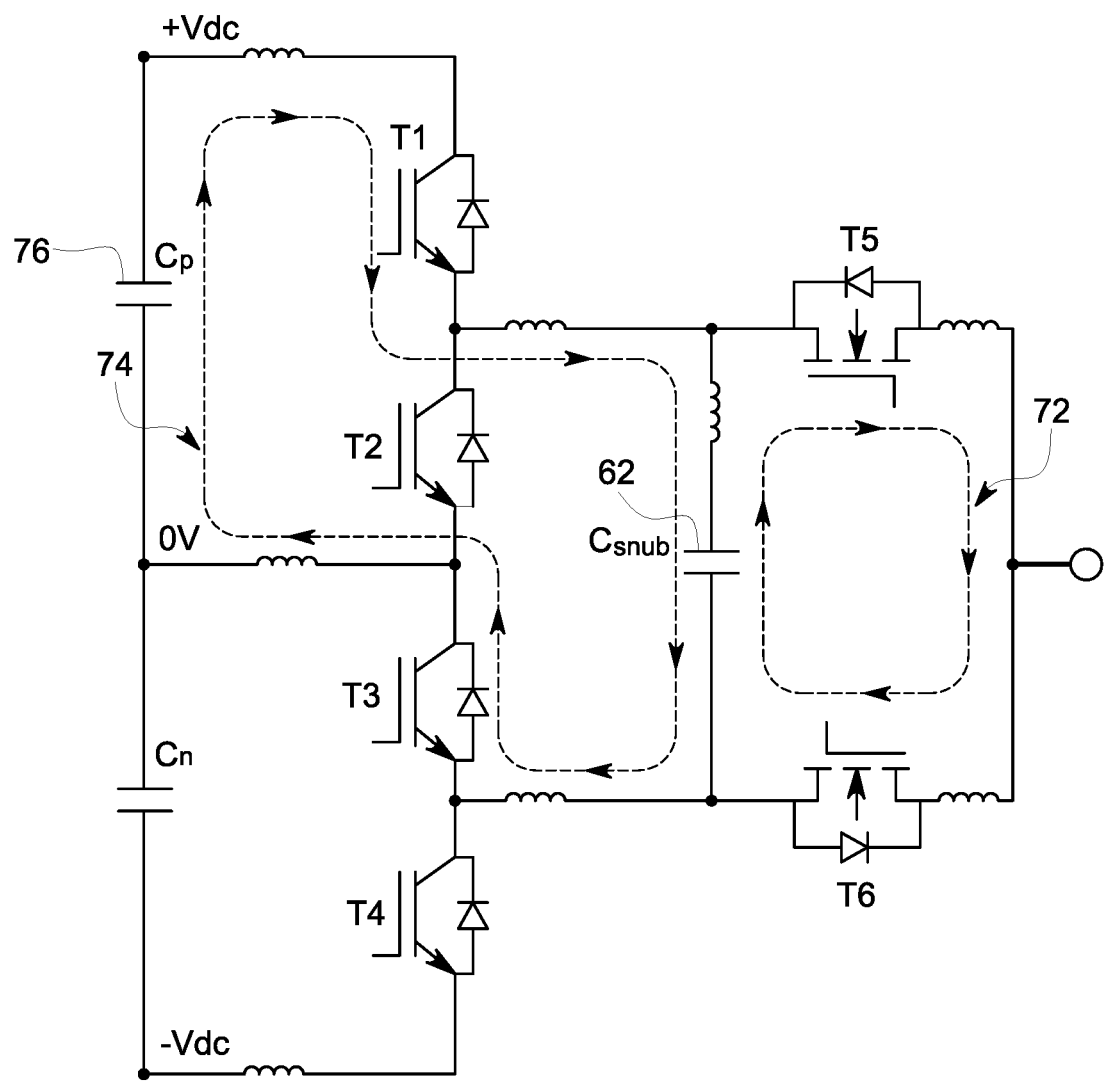
FIG. 4 illustrates schematic diagrams depicting a commutation loop for the 3L-TDANPC converter, in accordance with an embodiment.

When the 3L-TDANPC converter switches from the positive state 50 to P-type zero state 52, the current from switch T5 commutates to switch T6 via a snubber capacitor 62. Similarly, when the converter switches from the P-type zero state 52 to the positive state 50, the current from switch T6 commutates to switch T5 via the snubber capacitor 62. Thus, a commutation loop 72 for the SiC MOSFETs is among switches T5, T6 and the snubber capacitor 62 as shown in FIG. 4. It should be noted that during both positive state 50 and P-type zero state 52, Si switches T1 and T3 are always ON.

When the polarity of the output voltage changes from positive to negative, P state 50 is switched to N state 54 via P-type zero state 52. In negative state 54, Si switches T2 and T4 are ON. In other words, during the voltage change from the positive polarity to the negative polarity, the current from Si switches T1 and T3 is commutated to switches T2 and T4. Similarly, during the voltage change from the negative polarity to the positive polarity, the current from Si switches T2 and T4 is commutated to switches T1 and T3. Although the switches T1, T2, T3 and T4 experience hard switching (e.g., via a commutation loop 74 as shown in FIG. 4), the switching losses in them are very limited, given that they only switch at fundamental frequency (e.g., 60 Hz). The commutation loop 74 is formed between the snubber capacitor 62, Si switches and a DC link capacitor 76 of the DC voltage source.

Due to the parasitic inductance in the converter, resonant currents will be observed during the switching of the 3L-TDANPC converter, which can cause thermal and electromagnetic interference (EMI) issues if they are not damped properly, especially at heavy load conditions. The parasitic inductance in the converter depends on the system configuration and mechanical layout. Therefore, mitigation methods to damp such resonance is described herein.

Figure 5:
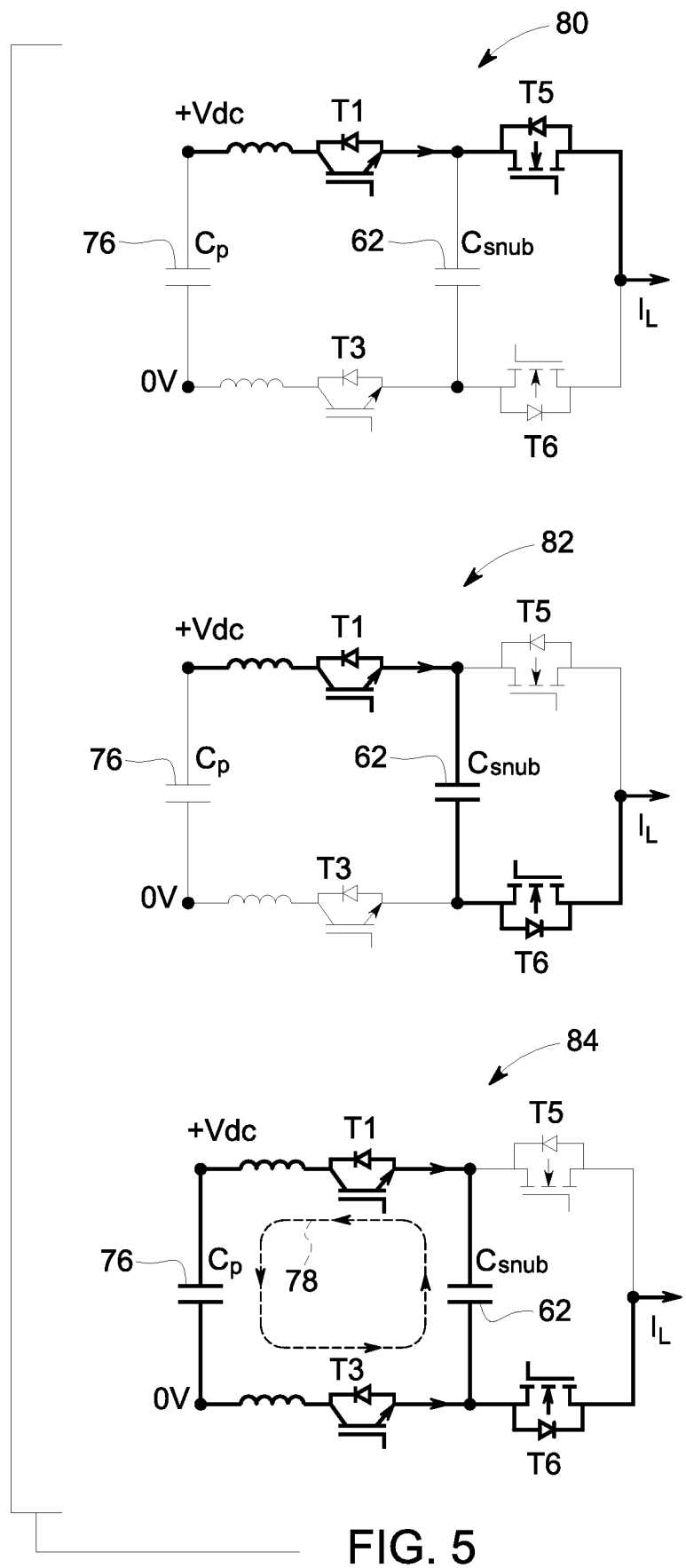
FIG. 5 illustrates schematic diagrams depicting a commutation process without damping in the 3L-TDANPC converter, in accordance with an embodiment.

FIG. 5 illustrates schematic diagrams depicting a commutation process in the 3L-TDANPC converter without any damping mechanism. Schematic diagram 80 depicts a "before commutation" operation, schematic diagram 82 depicts an "at commutation" operation and schematic diagram 84 represents an "after commutation" operation of the 3L-TDANPC converter for a case where both the output voltage and output current of the 3L-TDANPC converter are positive. It should be noted that each of the schematic diagrams 80, 82 and 84 shows a simplified version of the 3L-TDANPC converter and only shows a portion thereof. Moreover, the dark portion in each of the schematic diagrams shows the path of the load current.

Schematic diagram 80 shows that switches T1 and T5 carry a load current $I_L$ before the commutation process starts i.e., before the current $I_L$ is to be commutated from switch T5 to switch T6. After the current $I_L$ is commutated from T5 to T6, the current $I_L$ will continue flowing through switch T1 and charge the snubber capacitor 62 as shown in schematic diagram 82. Consequently, the snubber capacitor voltage increases and the voltage difference between the snubber capacitor and the DC bus capacitor 76 will reduce the current in switch T1 and increase the current in switch T3. After the current in switch T1 reaches zero, the load current $I_L$ is fully commutated to switch T3. However, at this moment, the snubber capacitor 62 is charged at a higher voltage than the DC-bus voltage across capacitor 76, and this voltage difference starts to drive a negative current though switch T1 and increase the current in switch T3, initializing a LC resonance as shown in schematic 84. The resonant frequency of the LC resonance is determined by the inductance of the commutation loop 78 and the snubber capacitor 62. For example, if the inductance (L) of the commutation loop 78 is 115 nH and the snubber capacitor capacitance value (C) is 2.72 µF, then the resonant frequency f of the LC resonance can be given as:

$$f = 1/2\pi\sqrt{LC} = 284 \text{ kHz} \quad (1)$$

Further, the voltage variation ($\Delta V_{snub}$) of the snubber capacitor is determined by a value (I) of the load current. For the above case, if the load current value is 600 A, then:

$$\Delta V_{snub} = 1\sqrt{L/C} = 123 \text{ V} \quad (2)$$

If the DC bus voltage is ±1000V, then the snubber capacitor voltage will be in the range from 877V to 1123V.

It should be noted that without any damping mechanism, the energy of the LC resonance will be damped eventually due to the resistance in the commutation loop. However, it is desirable to dissipate most of the energy in the Si devices rather than in other components in the commutation loop because it is much easier to cool the Si IGBT modules than other components such as the snubber capacitors. In addition, to minimize any EMI related issues, the resonance need to be damped as fast as possible. Therefore, a single pulse damping method is used in accordance with an embodiment of the present technique.

Figure 6:
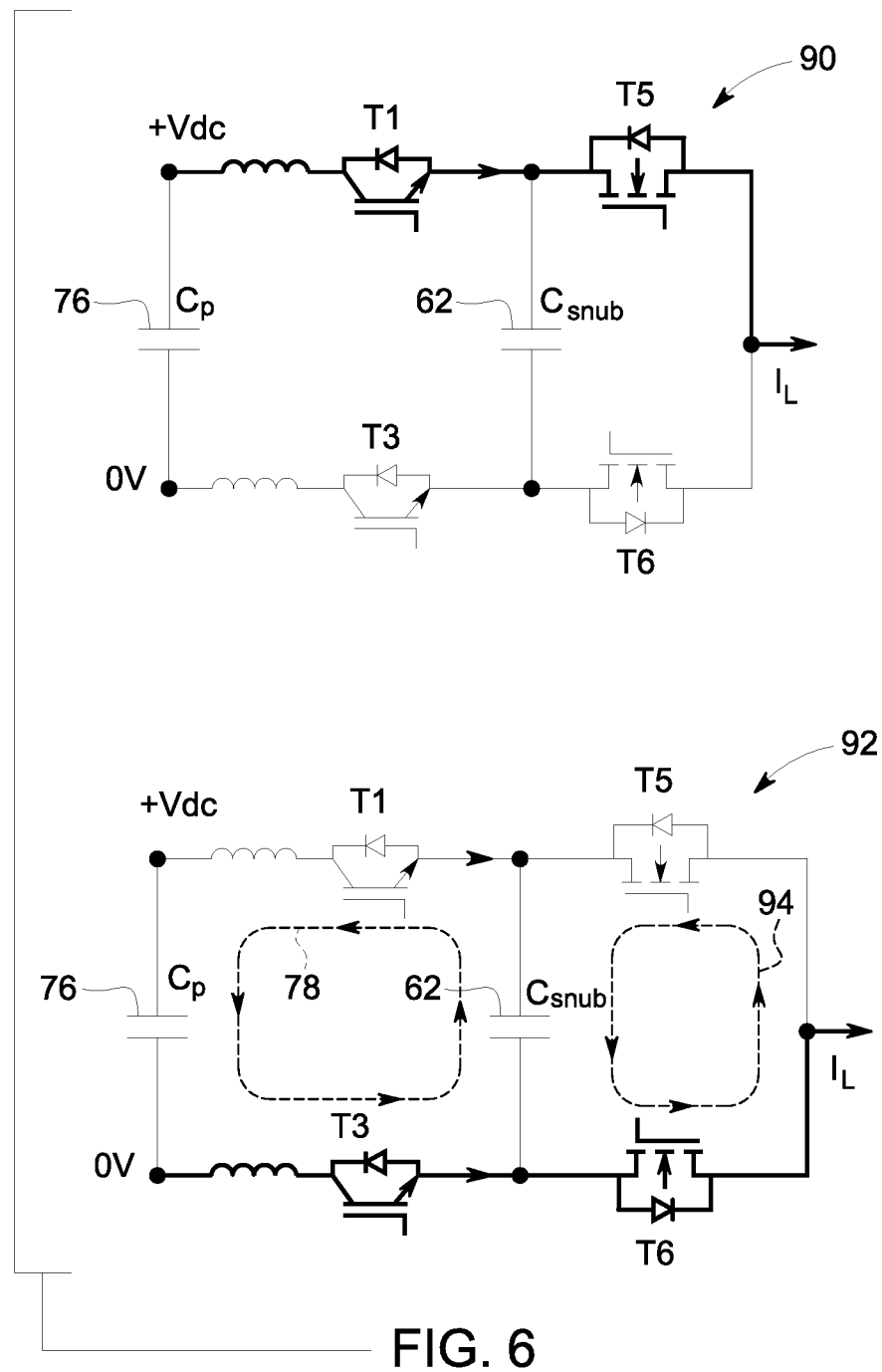
FIG. 6 illustrates schematic diagrams depicting a commutation process with a single pulse damping technique in the 3L-TDANPC converter, in accordance with an embodiment.

FIG. 6 illustrates schematic diagrams depicting a commutation process with a single pulse damping technique in the 3L-TDANPC converter. Schematic diagram 90 depicts a "before commutation" operation and schematic diagram 92 depicts an "after commutation" operation of the 3L-TDANPC converter for a case where both the output voltage and output current of the 3L-TDANPC converter are positive. It should be noted that each of the schematic diagrams 90 and 92 shows a simplified version of the 3L-TDANPC converter and only shows a portion thereof. Moreover, the dark portion in each of the schematic diagrams shows the path of the load current.

In the single pulse damping method, the processor 26 turns off switch T1 together or simultaneously with switch T5 for the purpose of damping the LC resonance that is formed during the commutation of current from switch T5 to T6. It should be noted that in FIG. 2, the gate pulses G1 and G3 which are applied to switches T1 and T3 are shown to be same. However, at this point, i.e., during the single pulse damping method, G1 is zero while G3 is still high and thus, switch T3 remains turned ON although switch T1 is turned OFF. Since switch T1 is in series of the loop inductance of the commutation loop 78, turning off T1 means breaking the current in the loop inductance. Breaking of the current in the loop inductance induces additional voltage across switch T1. Such additional voltage across switch T1, forces the current flowing through T1 to zero and thus, commutates the load current $I_L$ to switch T3 as shown in schematic 92. Once the resonance is damped, switch T1 can be turned ON again immediately. The whole process of damping the resonance takes very little time. In one embodiment, the resonance is damped in less than Thus, switches T1 and T5 are turned OFF simultaneously only for the purpose of eliminating the resonance current as fast as possible.

It should be noted that, FIG. 6 discloses the operation of the 3L-TDANPC converter when the output voltage is positive and output current is positive. However, the same method can be applied in other cases e.g., when the output voltage is zero and the current is positive as well as the when the output voltage and current are both negative. In other words, as long as the output voltage polarity and output current direction are same or at least when the output voltage is zero, the single pulse damping method described herein will damp the resonance.

Figure 7:
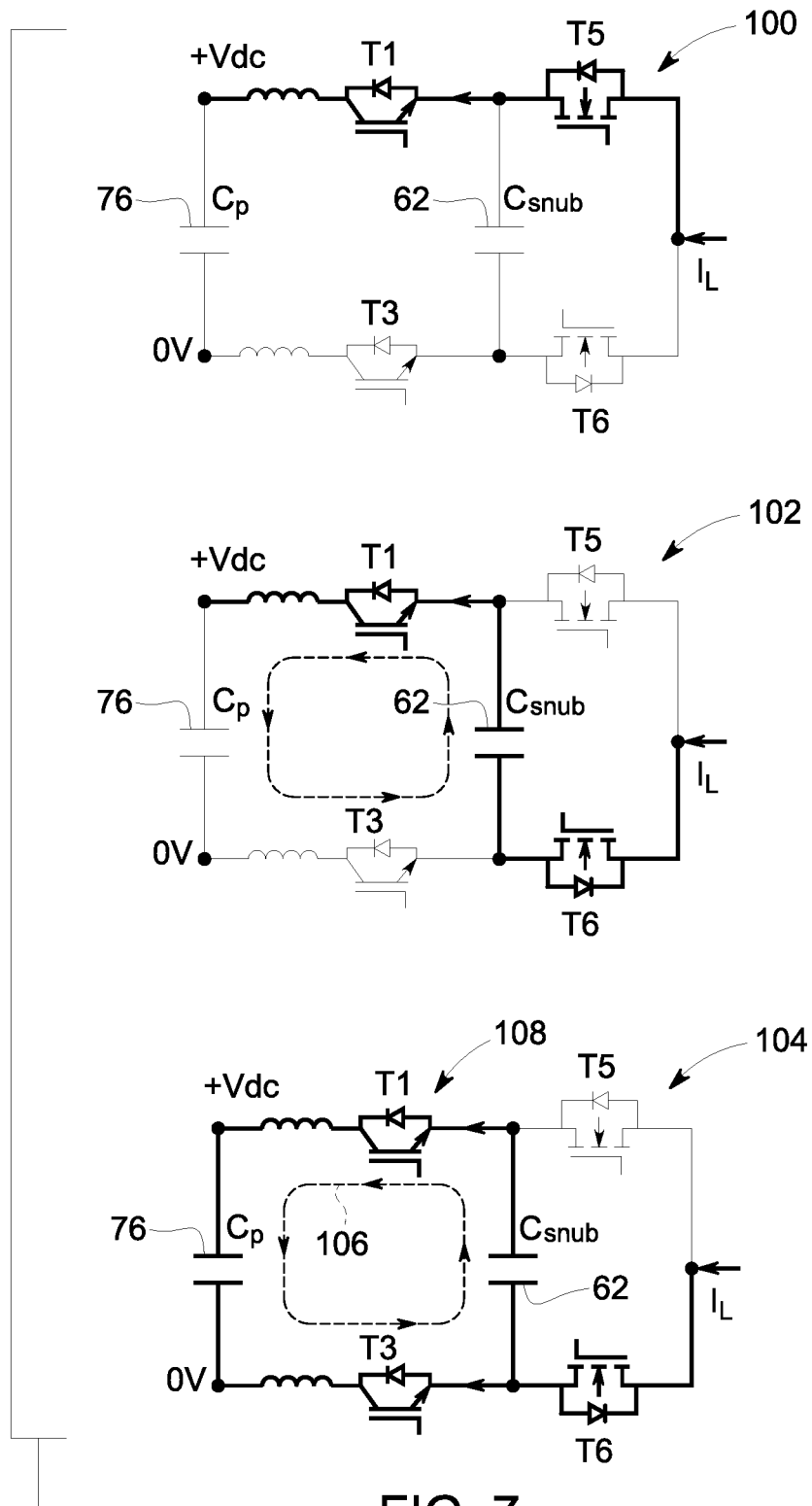
FIG. 7 illustrates schematic diagrams depicting a commutation process without any damping mechanism in the 3L-TDANPC converter for a case where the output voltage is positive and output current is negative, in accordance with an embodiment.

FIG. 7 illustrates schematic diagrams depicting a commutation process without any damping mechanism in the 3L-TDANPC converter for a case where the output voltage is positive and output current is negative. Schematic diagram 100 depicts a "before commutation" operation, schematic diagram 102 depicts an "at commutation" operation and schematic diagram 104 represents an "after commutation" operation of the 3L-TDANPC converter. It should be noted that each of the schematic diagrams 100, 102 and 104 shows a simplified version of the 3L-TDANPC converter and only shows a portion thereof. Moreover, the dark portion in each of the schematic diagrams shows the path of the load current.

When the output voltage is positive and output current is negative, as shown in schematic 100, the load current $I_L$ flows through an anti-parallel diode 108 of switch T1. Thus, even though switch T1 is turned OFF, the current will not be interrupted. When the current from switch T5 is commutated to switch T6, as shown in schematic 102, the load current commutated to switch T6 starts discharging the snubber capacitor 62. The snubber capacitor 62 will be discharged and the voltage difference between the snubber capacitor 62 and the DC capacitor 76 will commutate the current in switch T1 to switch T3, until the current in switch T1 is reduced to zero. Thereafter, a resonance circuit will be formed between the snubber capacitor 62 and switches T1 and T3 as shown in schematic 104 because both switches T1 and T3 are still ON. As discussed earlier, in absence of any damping mechanism, the resonance current 106 in the resonant circuit will die down eventually because of the resistance of the resonance circuit. However, it is desirable to eliminate the resonance as fast as possible to minimize any EMI related issues.

Figure 8:
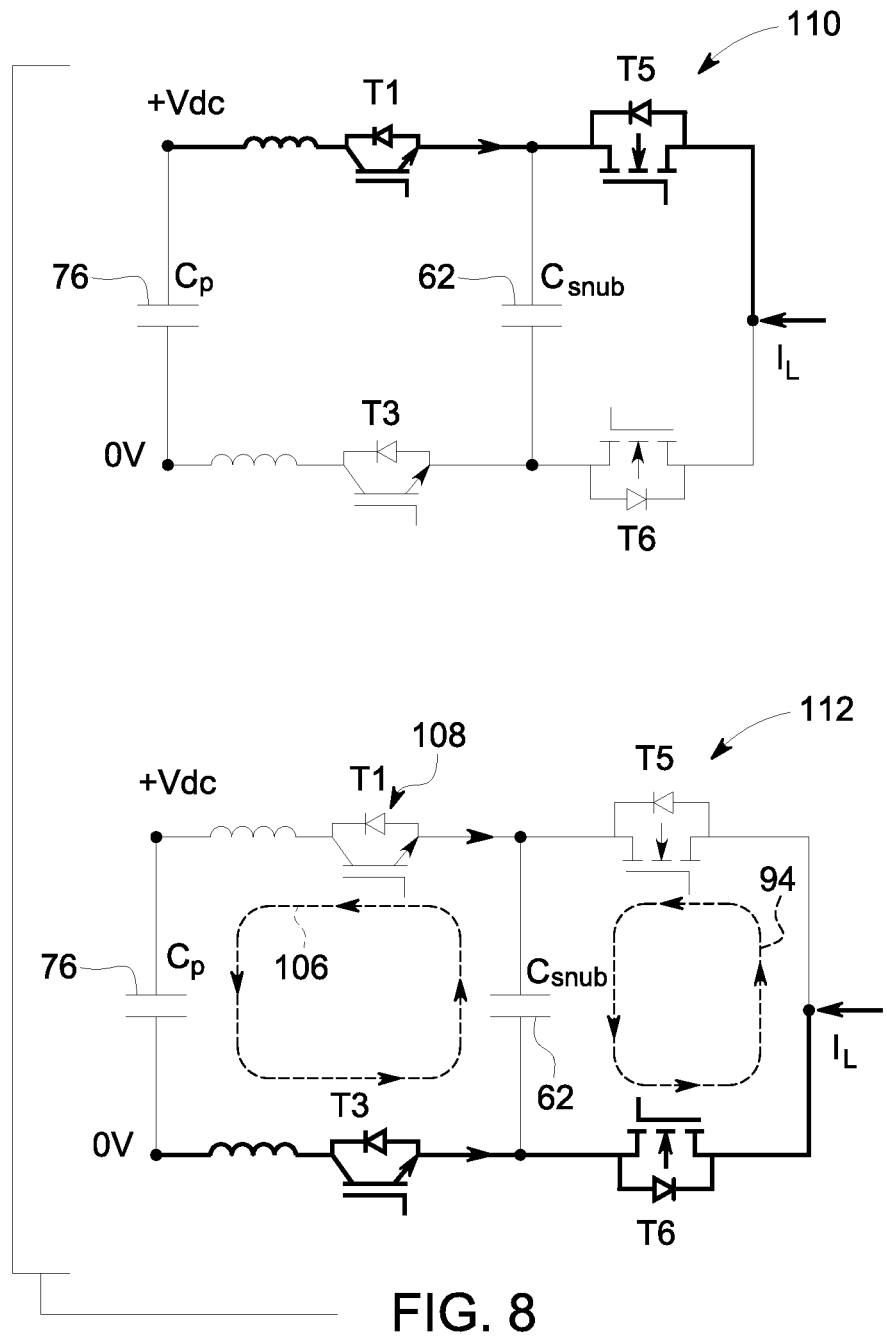
FIG. 8 illustrates schematic diagrams depicting a commutation process with a Gate-Off Active Damping technique in the 3L-TDANPC converter, in accordance with an embodiment.

FIG. 8 illustrates schematic diagrams depicting a commutation process with a Gate-Off Active Damping technique in the 3L-TDANPC converter. Schematic diagram 110 depicts a "before commutation" operation and schematic diagram 112 depicts an "after commutation" operation of the 3L-TDANPC converter for a case where the output voltage is positive and output current is negative. It should be noted that each of the schematic diagrams 110 and 112 shows a simplified version of the 3L-TDANPC converter and only shows a portion thereof. Moreover, the dark portion in each of the schematic diagrams shows the path of the load current.

In the Gate-Off Active Damping method, the processor 26 turns off switches T1 and T3 together for the whole switching cycle during which the current is being commutated from switch T5 to T6 or simultaneously with switch T5 for the purpose of damping the LC resonance that is formed during the commutation of current from switch T5 to T6. Since switch T1 is in OFF state, the resonant current 106 cannot reverse direction after the current in switch T1 is commutated to switch T3, as shown schematic 112. After this process, the snubber capacitor 62 is discharged via the load current, and the voltage difference between the DC capacitor 76 and the snubber capacitor 62 is blocked by the diode 108 of switch T1. Similar process is followed when the current is to be commutated from switch T6 to switch T5.

It should be noted that if the current direction is not known, for instance, when the current amplitude is not high enough to determine its direction, the single pulse damping method can also be used for the case where the output voltage polarity is different than the output current polarity. In such a case, if the resonance does occur, the impact is very limited, since the current level itself is low.

Figure 9:
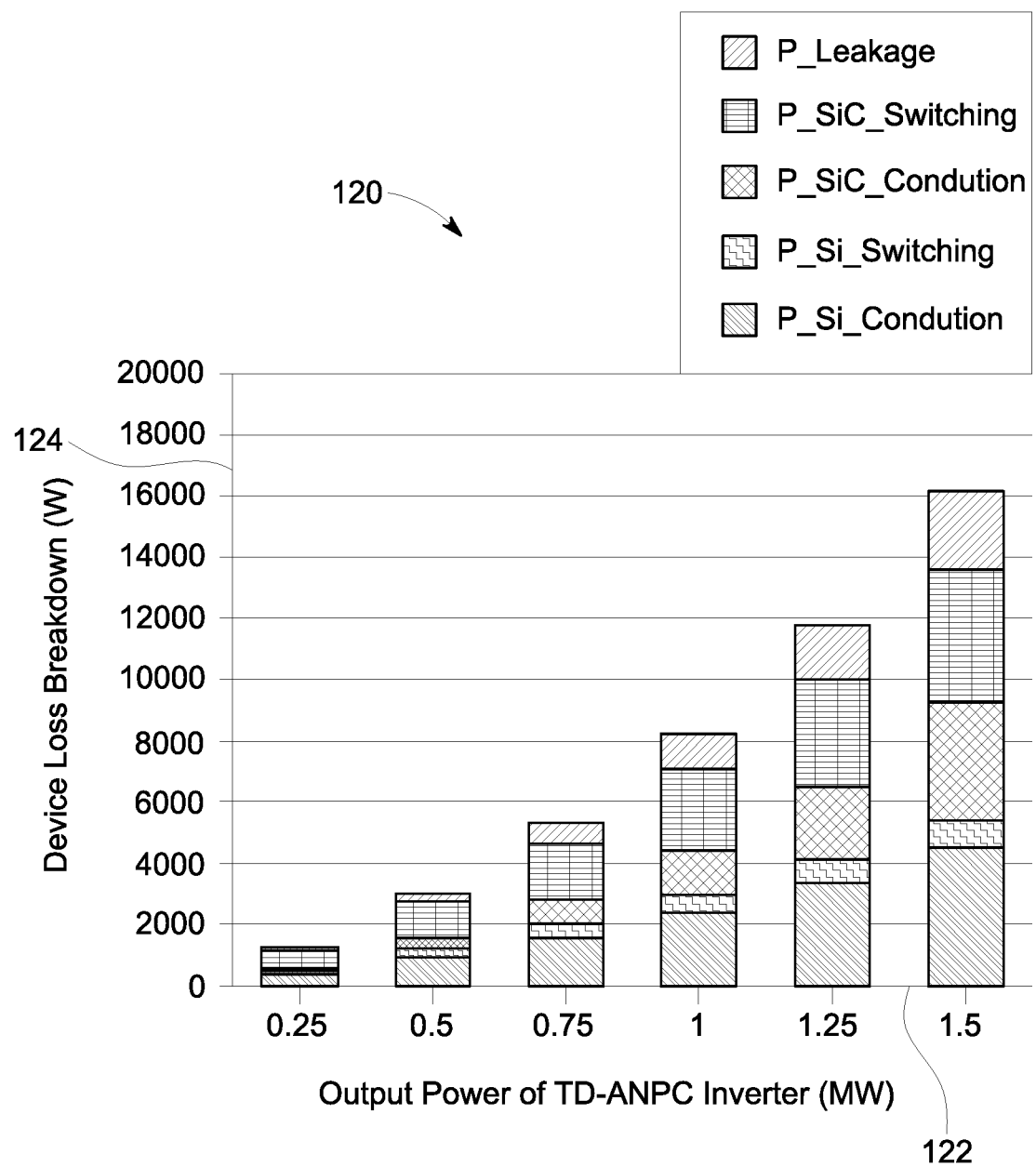
FIG. 9 illustrates a graphical plot of simulation results of the 3L-TDANPC converter based on a thermal modeling, in accordance with an embodiment.

FIG. 9 illustrates a graphical plot 120 of simulation results of 3L-TDANPC converter based on a thermal modeling. The simulation was carried out with a nominal DC-bus voltage of 2400V. A horizontal axis 122 of the plot 120 shows the output power of the TDANPC converter in Megawatt (MW) and a vertical axis 124 of the plot 120 shows the device loss breakdown of the TDANPC converter in Watt. As can be seen from the plot 120, the IGBTs conduction losses (P_Si_Conduction) and the SiC MOSFETs switching losses (P_Sic_Switching) are the two major components for the converter output power below or equal 1 MW. Above 1 MW of output power, the conduction losses of SiC MOSFET (P_Sic_Conduction) become more significant.

Figure 10:
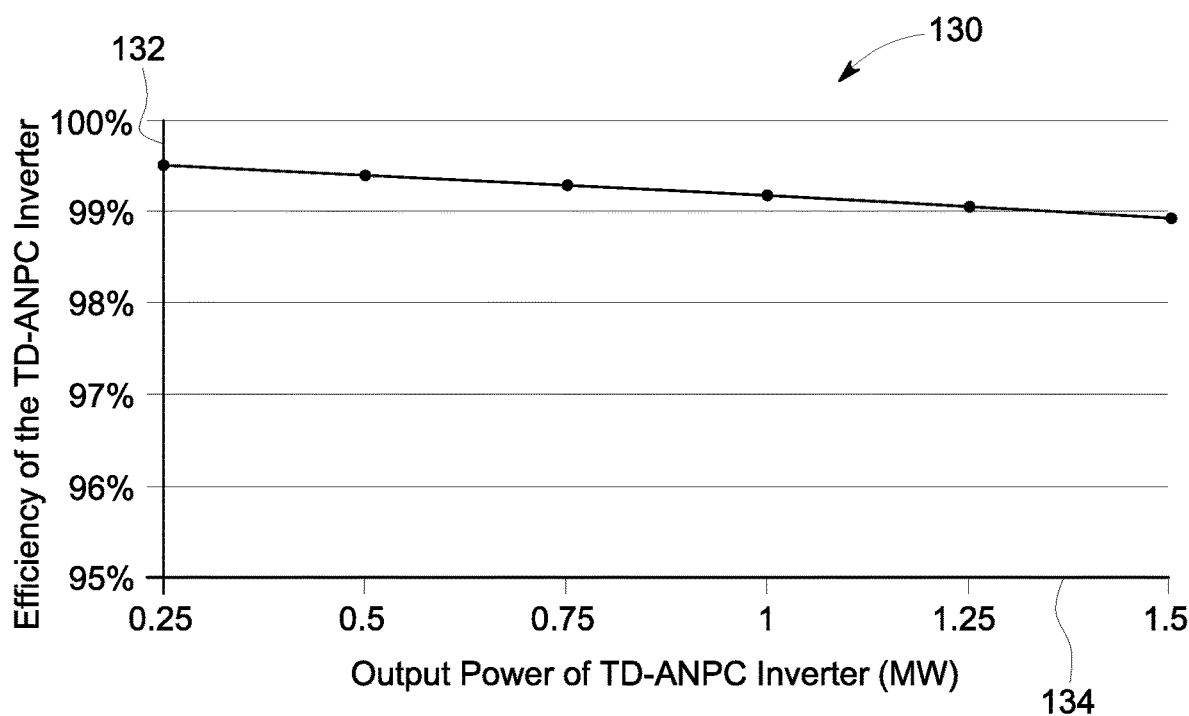
FIG. 10 illustrates graphical plot of an efficiency curve of 3L-TDANPC converter based on the simulation results, in accordance with an embodiment.

FIG. 10 illustrates a graphical plot 130 of an efficiency curve of 3L-TDANPC converter based on the simulation results. A horizontal axis 122 of the plot 130 shows the output power of the 3L-TDANPC converter in Megawatt (MW) and a vertical axis 134 of the plot 130 shows the efficiency of the 3L-TDANPC converter in percentage (%). As can be seen from plot 130, the converter efficiency of the 3L-TDANPC converter is 99.18% at 1 MW output power condition. At light load conditions, such as 25% load, the efficiency can be as high as 99.5%. Such high efficiency of the 3L-TDANPC converter mainly results from the fact that only the SiC MOSFETs are used for carrier frequency operation, and the Si IGBTs are only switched at fundamental frequency. It should be noted that the simulation for this case was conducted a switching frequency of 16.8 kHz. Also, the efficiency simulation here only considers Si and SiC devices losses and leakage losses in the commutation loop.

Figure 11:
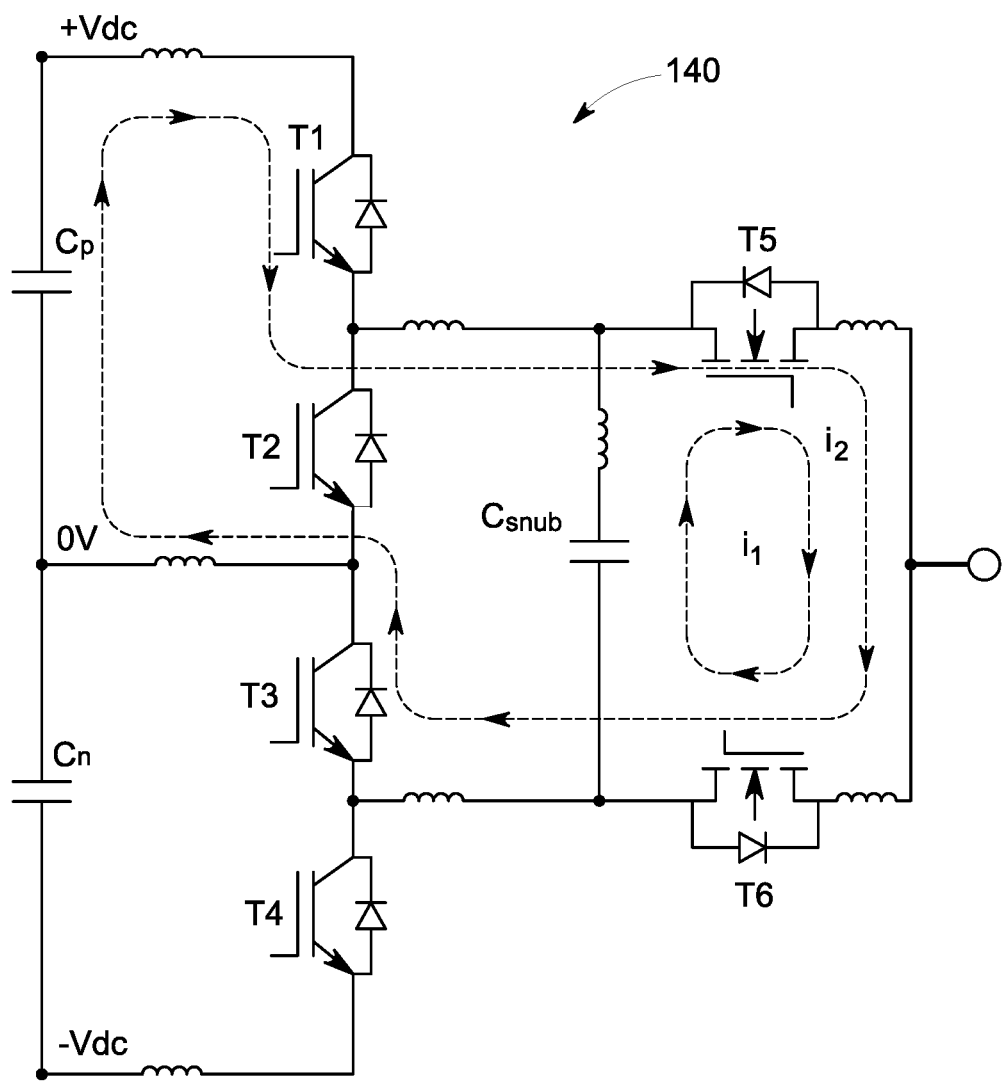
FIG. 11 illustrates schematic diagram depicting Fault current in the 3L-TDANPC converter during a short circuit fault, in accordance with an embodiment.

It should be noted that generally SiC MOSFETs have weak short circuit capability as compared to Si IGBTs i.e., SiC MOSFET cannot withstand a short circuit current (fault current) for as much time as much Si IGBTs can. For example, if Si IGBT can withstand the short circuit current for 10 μs then SiC MOSFET may be able to withstand the short circuit current for 1 or 2 μs. However, in 3L-TDANPC converter presented here, the SiC MOSFETs i.e., switches T5 and T6 can withstand more than 10 μs of a fault current (short circuit current), without any additional short-circuit current protection scheme in the gate drive. As illustrated in FIG. 11, the fault current through switches T5 or T6, during a short circuit condition, consists of two parts, (1) $i_1$ from the energy from the snubber capacitor and (2) $i_2$ from the DC bus capacitor. During the short circuit fault, $i_1$ ramps up very fast due to the low loop inductance, however, there is a limited amount of energy stored in the snubber capacitor. For example, for a schematic 140 shown in FIG. 11, the total energy is only 2 J and thus, the energy dissipated in each module is negligible. Further, the high loop inductance will limit the di/dt of current $i_2$. In addition, the peak value of current $i_2$ is limited by the saturation current level of the IGBT. For example, for a 600 A IGBT, when the gate voltage is 15V, $i_2$ will saturate at 3000 A, which is further shared by two SiC modules. Thus, it is safe for the SiC MOSFET to carry such low short-circuit current until the fault is cleared by a desat protection in the IGBT gate driver.

The benefits of this converter topology include: (1) Low switching losses in this IGBTs and SiC MOSFETs, due to the small commutation loops enabled by the addition of snubber capacitors; (2) Lower cost, as SiC MOSFETs are only used on the AC side; (3) Balanced thermal distribution among the switching devices in this topology; and (4) Short circuit fault capability of SiC MOSFETs because of the IGBTs.

This written description uses examples to explain the disclosure, including the best mode, and also to enable any person skilled in the art to practice the disclosure, including making and using any devices or systems and performing any incorporated methods. The patentable scope of the disclosure is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The invention claimed is:

1. A system, comprising: a voltage converter having a plurality of legs, each leg comprising:
    a first set of silicon (Si)-based power devices coupled across a first direct current (DC) voltage source, wherein the first set of Si-based power devices includes a first Si-based power device and a second Si-based power device connected to each other at a first interconnection node;

a second set of Si-based power devices coupled across a second DC voltage source, wherein the second set of Si-based power devices includes a third Si-based power device and a fourth Si-based power device connected to each other at a second interconnection node; a first set of silicon-carbide (SiC)-based power devices coupled across the first and second interconnection nodes, wherein the first set of SiC-based power devices includes a first SiC-based power device and a second SiC-based power device connected to each other at a third interconnection node;

a snubber capacitor connected across the first and the second interconnection nodes;

wherein the first set of Si-based power devices and the second set of Si-based power devices are connected to each other at a fourth interconnection node; and a controller for controlling an operation of the voltage converter, the controller configured to at least:

turn off one SiC-based power device of the first set of SiC-based power devices; and after turning off the one SiC-based power device and while the one SiC-based power device remains turned off, turn off at least one Si-based power device of the first set of Si-based power devices and the second set of Si-based power devices that is connected directly in series with the one Si—C based power device, wherein a switching loss of the at least one Si-based power device is reduced as a result of turning off the one SiC-based power device before turning off the at least one Si-based power device.

2. The system of claim 1, wherein the controller controls gates-pulses based on an output current polarity and an output voltage polarity.

3. The system of claim 1, wherein the controller operates the voltage converter in a plurality of operating states including a positive state, a P-type zero state, a negative state or a N-type zero state at any given time.

4. The system of claim 3, wherein the controller is configured to turn ON one Si-based power device from the first set of Si-based power devices and another Si-based power device from the second set of Si-based power devices during each of the operating states.

5. The system of claim 4, wherein the controller is configured to turn ON one SiC-based power device among the SiC-based power devices such that the one SiC-based power device and one of the Si-based power device that is turned ON during the corresponding operating state together carry a load current in series.

6. The system of claim 5, wherein the Si-based power device and the SiC-based power device that carry the load current in series include i) the first Si-based power device and the first SiC-based power device during the positive state, ii) the third Si-based power device and the second SiC-based power device during the P-type zero state, iii) the fourth Si-based power device and the second SiC-based power device during the negative state, and iv) the second Si-based power device and the first SiC-based power device during the N-type zero state.

7. The system of claim 6, wherein when the load current is to be commutated from one SiC-based power device to another SiC-based power device, the controller is configured to simultaneously turn off the Si-based power device and the SiC-based power device that carry the load current in series.

8. The system of claim 7, wherein the controller is configured to turn ON the Si-based power device that has been turned OFF simultaneously with the SiC-based power device after a resonance formed between the snubber capacitor and the Si-based power devices of the voltage converter is damped.

9. The system of claim 7, wherein the controller is configured to simultaneously turn off the Si-based power device and the SiC-based power device that carry the load current in series if an output voltage polarity and an output current polarity of the voltage converter are opposite of each other or if the output voltage is zero and the output current polarity is positive.

10. The system of claim 5, wherein the controller is configured to simultaneously turn off the Si-based power devices and the SiC-based power device which are ON if the output voltage polarity and the output current polarity of the voltage converter are opposite.

11. The system of claim 3, wherein a voltage at the third interconnection node is positive with respect to the fourth interconnection node in the positive state and the same is negative in the negative state.

12. The system of claim 11, wherein a voltage at the third interconnection node is zero with respect to the fourth interconnection node in the P-type zero state and N-type zero state.

13. The system of claim 12, wherein the controller is configured to turn ON the third Si-based power device in the P-type zero state and turn ON the second Si-based power device in the N-type zero state.

14. A system comprising:

a voltage converter having a plurality of legs, each leg comprising:

a first set of silicon (Si)-based power devices coupled to a first DC voltage source;

a second set of Si-based power devices coupled to a second DC voltage source, wherein the first set of Si-based power devices and the second set of Si-based power devices are coupled in series;

a first set of silicon-carbide (SiC)-based power devices coupled to the first set of Si-based power devices and to the second set of Si-based power devices;

a snubber capacitor connected across the first set of SiC-based power devices;

and a processor configured to at least:

control switching of each SiC-based power device of the first set of SiC-based power devices and each Si-based power device of the first and second sets of the Si-based power devices such that one SiC-based power device of the first set of SiC-based power devices is conducting a current in series with one Si-based power device of the first or the second set of Si-based power devices at any given time; and control switching of each SiC-based power device of the first set of SiC-based power devices and each Si-based power device of the first and second sets of the Si-based power devices, such that the one SiC-based power device that is conducting the current in series with the one Si-based power device is turned off prior to turning off the one Si-based power device and remains turned off while the one Si-based power device is turned off, wherein a switching loss of the one Si-based power device is reduced.

15. The system of claim 14, wherein when the current is to be commutated from one SiC-based power device to another SiC-based power device, the processor is configured to simultaneously turn off the one SiC-based power device of the first set of SiC-based power devices and the one Si-based power device of the first or second set of SiC-based power devices that are conducting the current in series.

16. The system of claim 15, wherein the processor is configured to turn ON the one Si-based power device that has been turned OFF simultaneously with one SiC-based power device after a resonance formed between the snubber capacitor and the Si-based power devices of the voltage converter is damped.

17. The system of claim 15, wherein the processor is configured to simultaneously turn off the one SiC-based power device and the one Si-based power device that are conducting the current in series if an output voltage polarity and an output current polarity of the voltage converter are opposite of each other or if the output voltage is zero and the output current polarity is positive.

18. The system of claim 15, wherein the processor is configured to simultaneously turn off the Si-based power devices and the SiC-based power device which are ON if the output voltage polarity and the output current polarity of the voltage converter are opposite.

19. The system of claim 14, wherein each of the first and second sets of Si-based power devices comprises one or more insulated-gate bipolar transistors (IGBTs).

20. The voltage converter of claim 14, wherein the first set of SiC-based power devices comprises one or more metal-oxide-semiconductor field-effect transistors (MOSFETs).

* * * * *